United States Patent [19]

Thurston

[11] Patent Number: 5,585,801
[45] Date of Patent: Dec. 17, 1996

[54] ANALOGUE-TO-DIGITAL CONVERTERS AND DIGITAL MODULATORS

[75] Inventor: Andrew M. Thurston, Chelmsford, United Kingdom

[73] Assignee: GEC-Marconi Limited, United Kingdom

[21] Appl. No.: 302,039

[22] Filed: Sep. 9, 1994

[30] Foreign Application Priority Data

Sep. 14, 1993 [GB] United Kingdom ............... 9318990

[51] Int. Cl.$^6$ ............................................. H03M 3/02
[52] U.S. Cl. .................................. 341/143; 341/166
[58] Field of Search ................................. 341/143, 166

[56] References Cited

U.S. PATENT DOCUMENTS

| | | | |
|---|---|---|---|
| 5,055,846 | 10/1991 | Welland | 341/155 |
| 5,124,703 | 6/1992 | Kaneaki et al. | 341/77 |
| 5,208,594 | 5/1993 | Yamazaki | 341/143 |
| 5,243,345 | 9/1993 | Naus et al. | 341/143 |
| 5,392,039 | 2/1995 | Thurston | 341/143 |

FOREIGN PATENT DOCUMENTS

| | | |
|---|---|---|
| 2232023 | 11/1990 | United Kingdom . |
| 2256331 | 12/1992 | United Kingdom . |
| 2266018 | 10/1993 | United Kingdom . |
| 2271896 | 4/1994 | United Kingdom . |

OTHER PUBLICATIONS

IEEE Journal of Solid–State Circuits, vol. 28, No. 3, Mar. 1993, "A Fourth–Order Bandpass Sigma–Delta Modulator", Jantzi et al., pp. 282–291.

Primary Examiner—Marc S. Hoff

[57] ABSTRACT

In a conventional sigma-delta converter/modulator, quantisation noise of the quantiser which produces the digital output is suppressed because of a feedback loop which feeds an error signal via a filter to the quantiser, the error signal being the difference between the digital output and the input. Improved noise suppression is achieved by more filter stages, but such converter/modulators require special measures to reset them in the event of an overload i.e. a high input signal. A modified output is taken from the filter which is such that a second filter appears, when the main loop is not overloaded, to be in a loop with a simple delay, i.e. a sigma-delta circuit. The main loop has the inherent recovery properties of a second order modulator/converter and cannot be swamped by the signal from the second loop because of a limiter and, when the main loop has recovered, so does the second loop containing second filter. However, the quantisation noise is now suppressed by the combined filters. In an analogue equivalent, the limiter receives a signal representative of each of those filter orders to permit an equivalent impulse response to be provided.

12 Claims, 4 Drawing Sheets

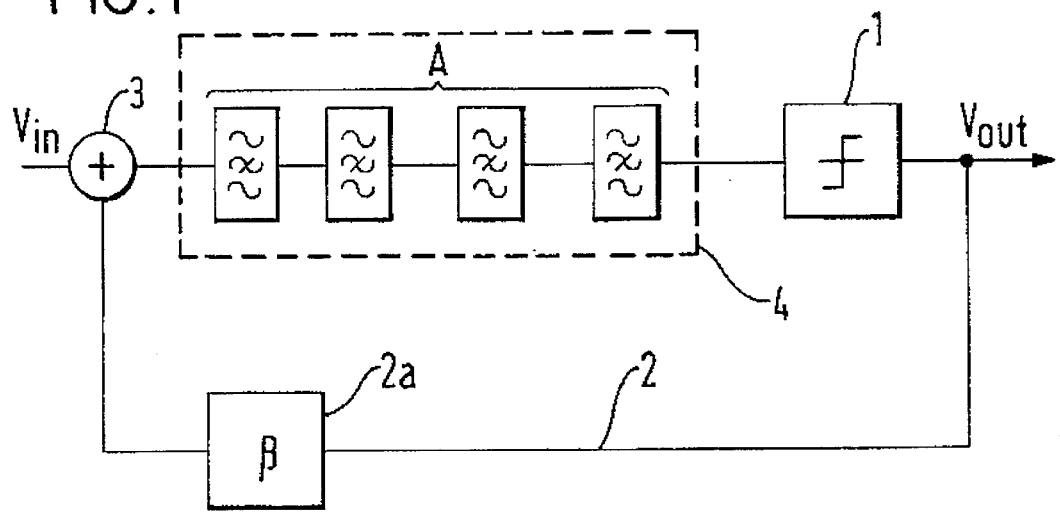
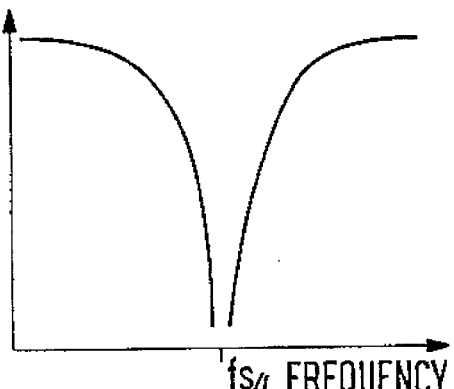
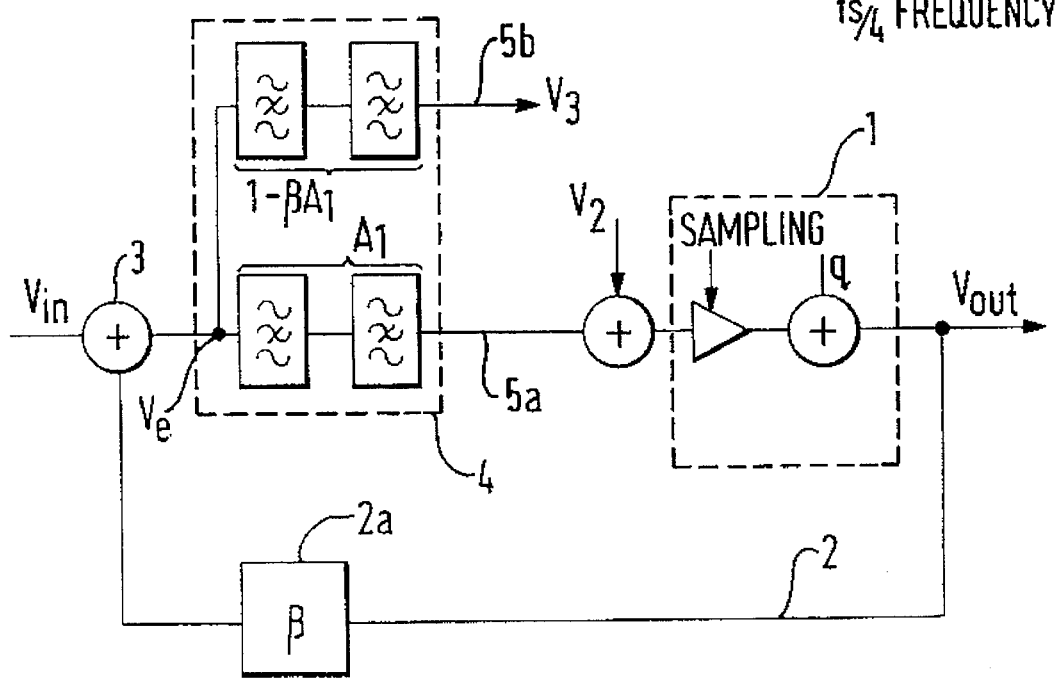

ANALOGUE-TO-DIGITAL CONVERTERS AND DIGITAL MODULATORS

BACKGROUND OF THE INVENTION

1. Field of the Invention

This invention relates to analogue-to-digital converters for both continuous and sampled data analogue signals, and to digital modulators, especially of the sigma-delta type.

The invention is particularly concerned with means of stabilising higher order converters and modulators, that is, with three or four, or possibly more filter stages.

1. Background Information

A fourth order sigma-delta converter/modulator is illustrated in FIG. 1. It comprises quantising means for producing a digital output, oversampled relative to the signal bandwidth, and a feedback path 2 with circuit element 2a having transfer function β (β is usually unity gain with phase shift/delay to produce the effect of negative feedback). The feedback path feeds the feedback signal to be combined with input $V_{in}$ at adder 3, so that an error signal representing the difference between the input and its representation in digital form by the quantising means 1 is fed into fourth order band pass filter means 4 of overall transfer function A. In the case of the analogue-to-digital converter for continuous analogue signals, the feedback path includes a digital-to-analogue converter so that the error signal represents the difference between the analogue input and its digital representation converted to analogue form. The output of the filter means is fed along a feedforward path to quantising means 1. The quantising means 1 is typically single bit (in the digital case, $V_{in}$ would be multi-bit), and the design permits improved signal to noise ratio to be obtained from coarse quantisation by shaping the quantisation noise spectrum to suppress it in a desired bandwidth (GB-A-2 232 023).

A typical quantisation noise spectrum is shown in FIG. 2. There is a notch in the quantisation noise spectrum at one quarter of the sampling frequency of the quantising means 1. The pass band of the converter/modulator is chosen to coincide with this, or other notches. The depth of the notch, and hence the signal-to-noise ratio, increases as the number of filter stages increases.

Unfortunately the tendency of the converter/modulator towards instability also rises as the number of filter stages increases. For example, consider the analogue-to-digital case in which the feedback path includes a digital-to-analogue converter, and the filter stages consist of LC (inductive/capacitive) circuits in parallel with each other. If the analogue input becomes too large, the feedback pulses produced by the digital-to-analogue converter will fail to cancel the analogue input, and the residual signal will build up in the filter stages, the signal increasing in each successive filter stage. When the input again falls within acceptable limits, the output of the converter remains controlled almost entirely by the continuing oscillations in the third and fourth stages and cannot revert to being representative of the input signal unless special reset means is provided.

It has been proposed to recover from such a situation by providing reset means which provides a short circuit across the third and fourth stage LC circuits when the output of the third and fourth stages exceeds predetermined values. But this temporarily interrupts operation of the converter, corrupting the output.

The Applicants have also proposed (GB-A-93 071 645) to provide limiters on the outputs of the third and fourth filter stages in an attempt to provide overload recovery. While limiters are sufficient to provide overload recovery for a third order sigma-delta converter (i.e. a circuit with three filter stages), attempts to provide overload recovery for a fourth order sigma-delta converter using the limiters have so far proved unsuccessful.

In deriving the present invention, the Applicants have now considered the problem of overload recovery from a radically different viewpoint. In particular, they have made use of the fact that a second order sigma-delta converter/modulator is inherently stable i.e. recovers from overload.

In FIG. 3, the architecture of FIG. 1 is repeated, except that the filter means 4 has been reduced to two stages, and the feedforward path 5a has been supplemented by an additional feedforward path 5b with a different transfer function. $V_e$ and $V_3$ represent the change in error voltage following adder 3, and in the second feedforward path, respectively, in response to an input $V_2$ applied before the quantising means 1. $V_e$ and $V_3$ are of course additional to voltages representing quantisation noise q and input voltage $V_{in}$.

When operating in an oversampled sigma-delta modulator/converter, the quantiser may be modelled as a linear gain amplifier with the addition of quantising noise q.

In FIG. 3, assuming $V_{in}=0$, and that the linearised gain of the quantiser is unity.

$V_{out}=V_{out}\cdot\beta\cdot A_1+V_2+q$, where $V_{out}$ is the output voltage, β the transfer function of the feedback path, and $A_1$ the transfer function of the filter means 4 in the feedforward path 5a.

Thus, $V_{out}(1=\beta\cdot A_1)=V_2+q$ and $V_{out}=V_2/(1=\beta\cdot A_1)+q/(1-\beta A_a)$ but $V_e=\beta V_{out}$ so $V_e=V_2\beta/(1-\beta\cdot A)+q\beta/(1-\beta A_1)$.

Hence the effect of adding in a voltage $V_2$ before the quantising means is to add a voltage of $V_2\beta(1-\beta A_1)$ to the error signal. If now this voltage passes through the filter means 4 along a path having a transfer function $1-\beta A_1$, then $V_3=\beta\ V_2$.

If β is unity gain and just represents a delay, it follows that the path from where $V_2$ is injected to $V_3$ acts as a simple delay.

Thus if a further filter is connected between $V_3$ and $V_2$, the circuit behaves as if the filter was connected in a loop containing quantising means 1, an input $V_{in}$ and a delay i.e. a sigma-delta loop. Note that this only applies while the loop containing the filter means 4 in its output along feedforward path 5a is not overloaded.

Thus, the benefits of higher filter order noise shaping can be obtained without the problem of instability by arranging that the highest order of the filter appears to be set in its own sigma-delta circuit. This applies to analogue-to-digital converters for continuous and sampled data signals, as well as to digital modulators.

SUMMARY OF THE INVENTION

The invention provides a sigma-delta circuit comprising quantising means for producing a digital output, a feedback path for feeding a signal derived from the digital output to be combined with a signal derived from an input to form an error signal, and first filter means connected to receive the error signal as input, a first output of the first filter means being fed to the quantising means, and second filter means also connected to the quantising means but via limiting means from a second output of the first filter means having a transfer function from its input such that the second filter means forms a sigma-delta circuit which includes the quantising means and the feedback path when the first-mentioned sigma-delta circuit is not overloaded.

The benefits of higher order noise shaping can be obtained without the problem of instability. The noise shaping is dominated by the combined effects of the first and second filter means. In the event of overload, recovery is assured (provided the first and second filter means are such that their respective sigma-delta circuits are inherently stable), since the sigma-delta loop including the first output of the first filter means recovers since the signal added to the quantising means from the second filter means is limited and cannot swamp it and, when that loop has recovered, the loop containing the second filter means behaves as a sigma-delta circuit and also therefore recovers. The first and second filter means may be first order (one filter stage) or second order (two filter stages) for their respective sigma-delta circuits to be inherently stable, but either could be third order (three filter stages) if limiters are provided on the outputs of the third filter stage because that would also be inherently stable.

The invention also provides an analogue-to-digital converter for sampled data signals, comprising quantising means for producing a digital output, a feedback path for feeding a signal derived from the digital output to be combined with a signal derived from the sampled data signal for input to first filter means having one or two stages, a first feedforward path for feeding a first output of the first filter means to the quantising means, a second feedforward path for feeding a second output of the first filter means via second filter means having one or two stages and limiting means, to the quantising means, the transfer function between the input of the first filter means and its second output being such that the transfer function between the output of the second filter means around the feedback path and the second feedforward path to the input of the second filter means is defined over the passband of the converter by a phase response such as to produce a delay.

Quantisation noise will be suppressed according to the second feedforward path, i.e. the combined effects of the one or two stages of the first filter means and the one or two stages of the second filter means, which will dominate the noise suppression effect of the first feedforward path. In response to a momentary overload, the first feedforward path recovers since the contribution to the quantising means from the second feedforward path is limited and cannot swamp it, and because of the inherent nature of a second order sigma-delta circuit (the same applies to a first order sigma-delta circuit). When the first feedforward path has recovered, the second filter means appears to be in a loop with quantising means and a delay, and also recovers because of the inherent overload recovery of first or second order sigma-delta circuits.

The invention also provides a digital modulator comprising quantising means for producing a digital output with a lower number of quantisation levels than the input, a feedback path for feeding a signal derived from the digital output to be combined with a signal derived from the digital input for input to first filter means having one or two stages, a first feedforward path for feeding a first output of the first filter means to the quantising means, a second feedforward path for feeding a second output of the first filter means via second filter means having one or two stages and limiting means, to the quantising means, the transfer function between the input of the first filter means and its second output being such that the transfer function between the output of the second filter means around the feedback path and the second feedforward path to the input of the second filter means is defined over the passband of the converter by a phase response such as to produce a delay.

Advantageously, the transfer function between the input of the first filter means and its second output is preferably substantially the inverse of the function by which the quantisation noise would be suppressed by the first feedforward path in the absence of the second feedforward path. This results in the transfer function between the output of the second filter means around the feedback path and second feedforward path to the input of the second filter means being substantially a simple delay. The circuit will be stable even if the amplitude response results in some filtering provided the phase response results in the delay. Preferably the amplitude response is substantially flat over the passband of the circuit.

The invention also provides an analogue-to-digital converter for continuous analogue signals comprising quantising means for producing a digital output, a feedback path for feeding a signal derived from the digital output to be combined with a signal derived from the analogue input for input to first filter means having one or two stages, a first feedforward path for feeding a first output of the first filter means to the quantising means, a second feedforward path for feeding a second output of the first filter means via second filter means having one or two stages and limiting means to the quantising means, the input to the limiting means being representative of each filter order of the first filter means combined with the second filter means along the second feedforward path.

Because the input to the limiting means is representative of each filter order, it is possible to combine them in suitable ratios for the impulse response of the combined first and second filter means along the second feedforward path to match the response of the first and second filter means along the second feedforward path for the sampled data converter and digital modulator, at the sampling instants, in order to provide the transfer function over the converter passband referred to i.e. a substantially flat amplitude response and a phase response to produce a delay i.e. substantially a simple delay, which is the key to stable operation.

Advantageously, the quantising means is single bit.

Sigma-delta analogue-to-digital converters for sampled data and continuous analogue signals and sigma-delta modulators for digital signals, constructed in accordance with the invention, will now be described, by way of example, with reference to the accompanying drawings, in which:

BRIEF DESCRIPTION OF THE DRAWINGS

FIG. 1 is a block diagram of a fourth order sigma-delta converter/modulator;

FIG. 2 is a graph of a typical quantisation noise spectrum;

FIG. 3 is a block diagram of a modified converter/modulator;

DETAILED DESCRIPTION OF THE PREFERRED EMBODIMENTS

Figure 4:
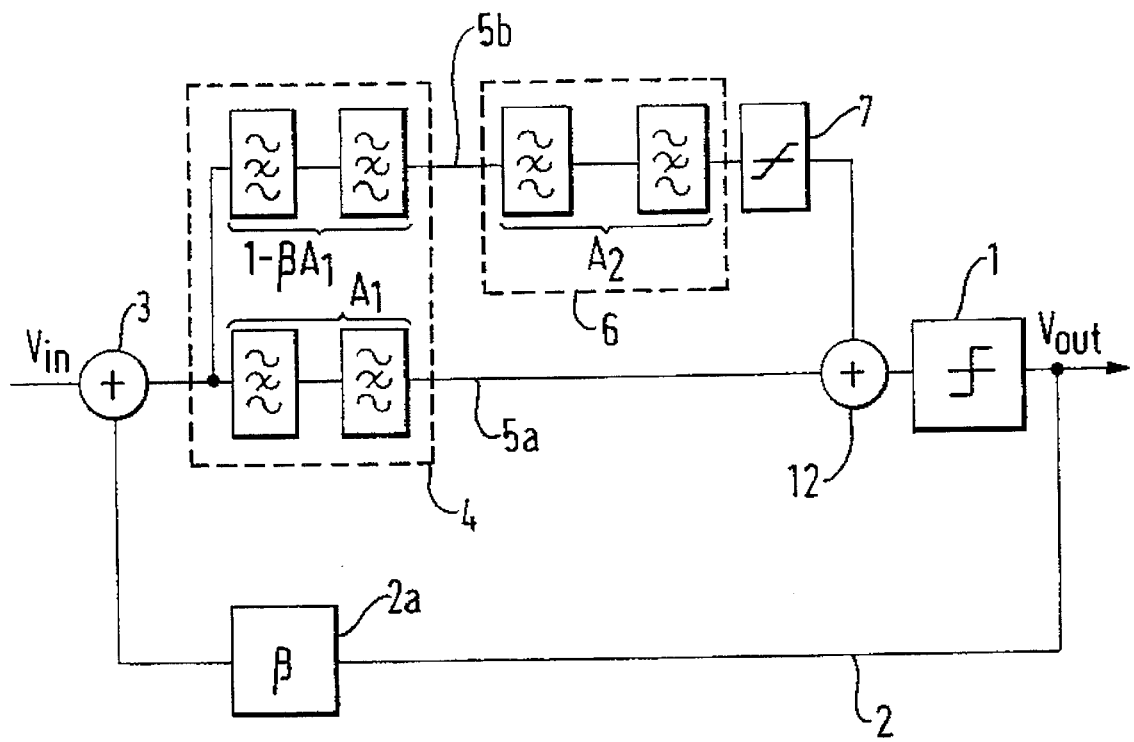
FIG. 4 is a block diagram of a fourth order sampled data converter/digital modulator.

Like reference numerals have been given to like parts throughout all the figures. Referring to FIG. 4, the architecture applies equally to digital inputs or sampled data inputs, but reference will first be made to the latter. Sampled data input pulses are received at adder 3 and a digital output is produced by a sampled quantising means 1. This is fed back along feedback path 2 having a circuit element 2a with transfer function $\beta$ (comprising delay $\beta$ and unity gain) to produce an error signal representing the difference between the sampled data input and its representation in digital form, which is fed into the filter means 4.

A first feedforward path 5a feeds a first output of the filter means 4 having a transfer function $A_1$ into the quantising means 1 via summing node 12.

A second feedforward path 5b feeds a second output of the filter means 4 having a transfer function substantially $(1-A_1 \beta)$ to a second filter means 6 having a transfer function $A_2$. It will be noted that the function $(1-A_1 \beta)$ is the inverse of the theoretical function by which the main loop on its own suppresses quantisation noise. The output of this filter means is fed to the quantising means 1 via limiting means 7 and summing node 12.

As explained above $(V_3=\beta \cdot V_2)$, the filter means 6 appears to be in a loop containing quantising means 1, a delay $\beta$ and an input node 3, and hence behaves like a sigma-delta converter. This is only true while the main sigma-delta loop encompassing the first feedforward path 5a is not overloaded, and limiting means 7 is provided to prevent the second feedforward path from overloading the main sigma-delta loop. It should also be noted that the filter means 6 only appears to be in a loop with a simple delay to the extent that the transfer function of the second output of the filter means 4 is exactly $(1-A_1 \beta)$. However, this is difficult to attain in practice, but the circuit works so long as the transfer function is close to $(1-A_1 \beta)$. The result is that, in addition to the delay $\beta$, there is some filtering between $V_2$ and $V_3$.

Quantisation noise will be suppressed according to the number of filter stages of the second output of the filter means 4 and of the filter means 6. This has been shown symbolically as four in FIG. 4, although filter means 6 could have a single stage if desired and/or there could be a single stage in filter means 4. A four stage filter means would normally be unstable, in the event of overload i.e. if $V_{in}$ becomes too large. However, in this case, when the input returns again to its normal limits, the sigma-delta of the first feedforward path 5a cannot be prevented from recovering by the second feedforward path 5b since the latter is limited. Also, since the sigma-delta of the first feedforward path 5a is a second order converter, it inherently recovers. When this has happened, the second output of the first filter means must also have recovered since they are fed the same error signal pulses. When this happens, the second filter means itself appears to lie in a sigma-delta loop and, since the second filter means 6 is also second order this inherently recovers as well.

Hence the converter has noise suppression associated with higher filter orders without the problem of overload recovery normally encountered with such orders. Switching noise introduced by the action of the limiting means is applied directly to the input of the quantising means and is thus fully noise shaped. As a result it does not matter is the limiting means is activated during normal operation and hence the third and fourth filter coefficients (the ratios of the outputs of the third and fourth stages applied to the limiting means) may be set relatively high to give improved performance.

Both filter means have been shown symbolically in the drawings: in reality individual outputs of each of the two stages of the filter means 4 feeding the first feedforward path may be connected to the quantising means 1 and outputs may be taken from each of the two stages of the filter means 4 feeding the first feedforward path 5b and of the two filter orders of the filter means 6 and may be fed directly to the limiting means 7. Also, the two feedforward outputs 5a, 5b are shown as being connected to different filters (within the overall dashed box 4). In practice, the first and second outputs of the filter means may be produced by separate filters, or by a common filter network with different output connections.

The principle of the invention may be extended to higher filter orders. Thus, a separate output may be provided from the filter means 6 to provide an output $(1-\beta A_2)$ and this may be fed to a third filter means e.g. of two stages of transfer function $A_3$ and a further limiting means, to be connected into the second feedforward path before the limiting means 7. This third filter means would then itself appear to lie in a second order sigma-delta loop and would have the associated inherent recovery properties, while the quantisation noise would be suppressed according to a sixth order filter. Indeed, the principle of nesting sigma-delta converters may be extended to further orders, particularly if single stage filters were employed in each of the filter means.

Suitable components for the filters of FIG. 4 are switched capacitor filters (described in "A fourth order bandpass sigma-delta modulator", Jantzi, Snelgrove, Ferguson, IEEE Journal of Solid State Circuits, Vol. 28, No. 3, March 1993).

The same circuit may be used as a digital modulator, in which case the output $V_{out}$ has a lesser number of quantisation levels e.g. two than the input $V_{in}$. In such a case, the filters are digital filters.

The circuit is suitable for bandpass implementations or baseband implementations and, in the latter case, the filter means will reduce to integrators, e.g. combinations of capacitors, resistors and operational amplifiers.

Figure 5:
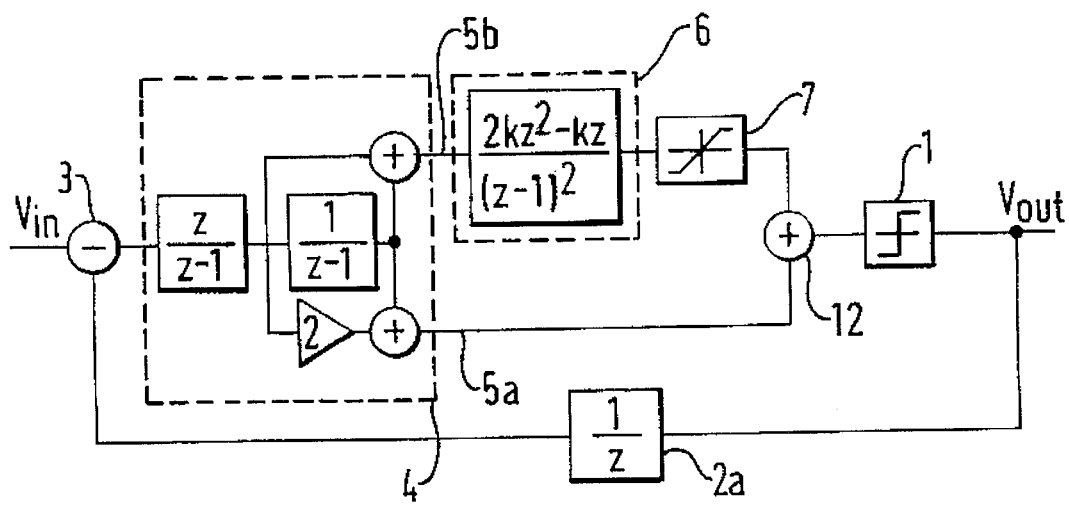
FIG. 5 is a block diagram of a fourth order digital modulator.

Referring to FIG. 5, a suitable digital implementation is shown, which is a baseband modulator. FIG. 5 is an example of a fourth order baseband digital sigma-delta modulator. The first filter stage $(z/(z-1))$ is a simple integrator, whilst the second filter stage $(1/(z-1))$ is an integrator with a one sample period delay. The feedback path contains $\beta$, a simple delay of $z^{-1}$. The filter element 6 is a second order filter with a variable gain coefficient k. The value of this gain coefficient and the dynamic range of the limiter may be adjusted to optimize the behaviour of the modulator. Subtraction occurs at node 3 to provide the required negative feedback: in the bandpass implementation, the phase inversion due to the delay causes the subtraction, so addition takes place at the node 3.

If desired the modulator could instead be implemented in bandpass form.

Figure 6:
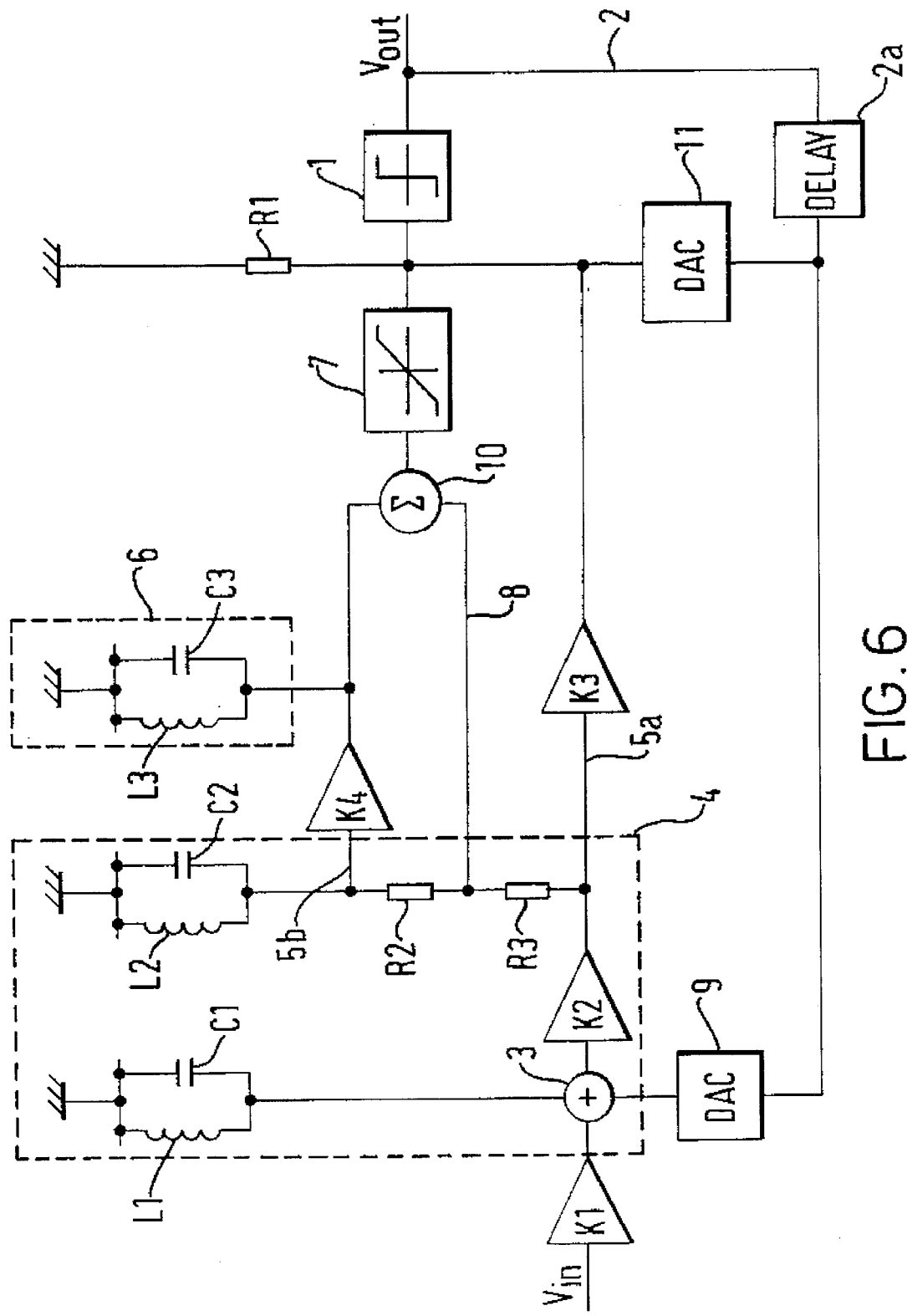
FIG. 6 is a block diagram of a third order analogue-to-digital converter for continuous analogue signals.

Referring to FIG. 6, a third order bandpass analogue-to-digital converter for continuous analogue signals comprises a two stage first filter means 4, having parallel inductor capacitor L1C1, L2C2 for each stage. The second filter means 6 also comprises a parallel inductor capacitor L3C3.

A correction digital-to-analogue converter 11 applies feedback pulses derived from the digital output direct to the input of the quantising means 1 to provide damping (as claimed in our co-pending application number GB-2 256 331).

The buffers K1 to K4 are transconductance amplifiers; a voltage at the input is converted into a current at the output. Thus, an input analogue voltage is converted to a current which drives the first stage L1C1 of the filter means 4. The resulting oscillating voltage appears as an input to the second stage L2C2 of the filter means, in series with the resistors R2, R3. The current (due to buffer K2) flowing through that series branch provides voltages applied to feedforward paths 5a, 5b and 8. The voltage applied to buffer K3 along feedforward path 5a is representative of the first and second orders of the filter means 4, in that the voltage may be considered to consist of two components, namely, a component due to the voltage developed across L1C1 appearing across resistors R2, R3, and a component due to the voltage developed across L1C1 appearing across L2C2. The combined voltage appears at the quantising means 1 as a voltage developed in resistor R1 by the current output of buffer K3.

Thus the first feedforward path forms a first sigma-delta loop. The delay 2a in the feedback loop 2 also forms part of the sigma-delta loop. The main digital-to-analogue converter 9 is provided to convert the digital output into analogue form so that an error signal representing the difference between the analogue input and the digital output converted to analogue form, is fed to the filter means 4.

A second feedforward path 5b from a second output of the filter means 4 applies a voltage representative only of the second filter order of the filter means 4, to buffer K4 which excites the single stage of the filter means 6. This current, representative of the third order of the combined filter means 4, 6, passes via limiting means 7 to R1 to provide a voltage output for quantising means 1.

It is essential for the limiting means 7 to receive currents representative of each order of the combined filter means 4, 6 along the second feedforward path, so adder 10 receives a current along feedforward path 8 representative of the first and second filter orders of filter means 4, due to the voltage developed across L1C1 appearing across L2C2 (second order) and R2 (first order). This is necessary to produce the desired (open loop) impulse response for the filter means 4, 6. The required impulse response must be the same at the sampling instants as the response of the corresponding digital/sampled data converter of FIGS. 4 and 5. That is, if the impulse response of the filter means 4 at the first output 5a corresponds to transfer function $A_1$, and the impulse response of the filter means 6 corresponds to transfer function $A_2$, the impulse response from the input of the filter means 4 to the input of the quantising means 1 must correspond to a transfer function of substantially $(1-A_1 \beta) \cdot A_2$, where $\beta$ is the delay around the feedback path. $(1-A_1 \beta)$ is the factor by which noise is suppressed in the main loop. All the filter orders must be individually available to be summed at adder 10, and must be individually adjustable by alteration of K2, K3, K4, R2 and R3.

A typical application for the circuit of FIG. 6 would be for 100 kHz bandwidth signals centred on 2.5 MHz and oversampled at a sampling rate (for the quantising means 1) of 10 MHz. L1C1, L2C2 and L3C3 would each be tuned to 2.5 MHz, corresponding to the notch in the quantisation noise at one quarter of the sampling frequency.

Figure 7:
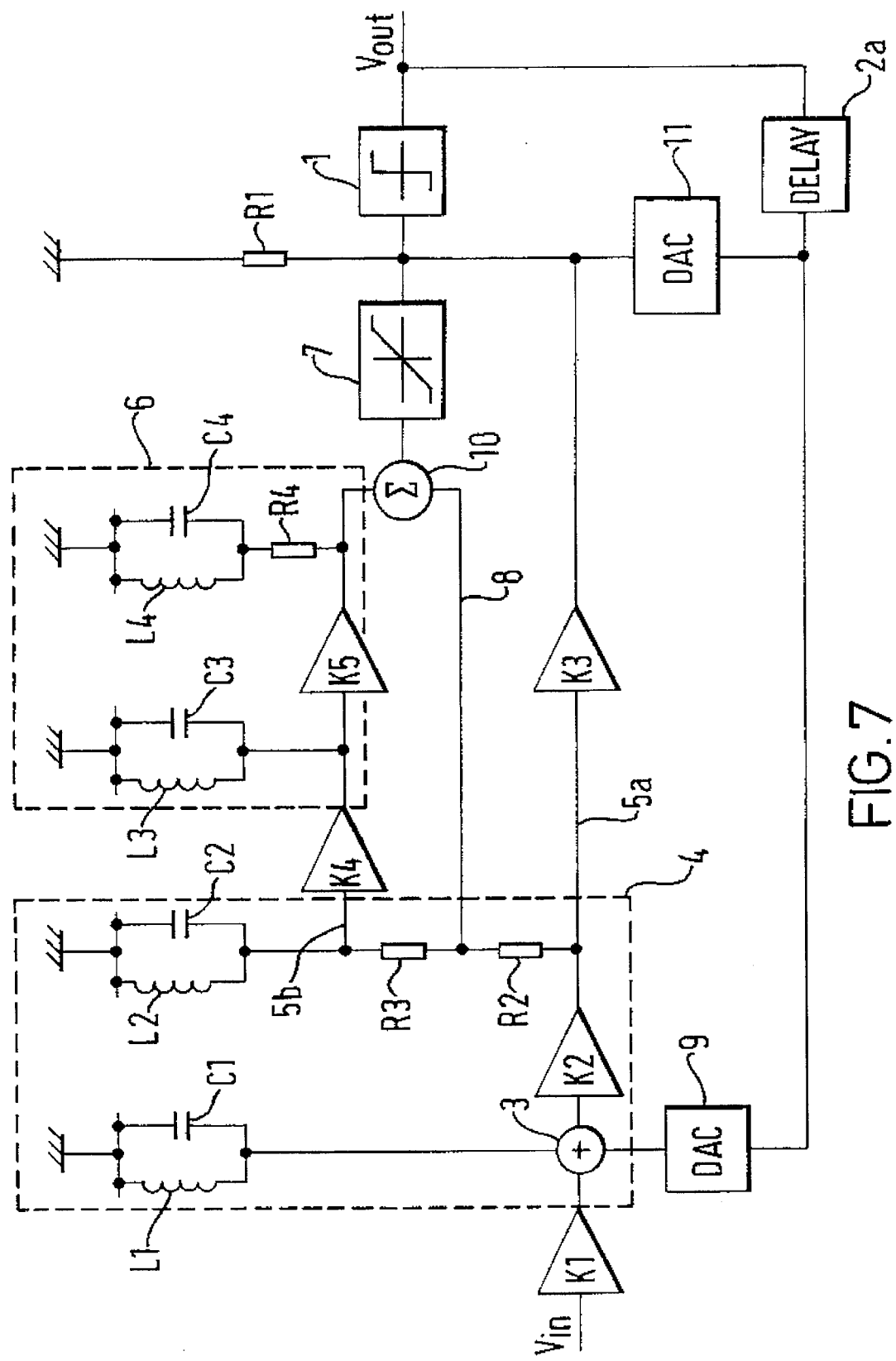
FIG. 7 is a block diagram of a fourth order analogue-to-digital converter for continuous analogue signals.

The fourth order sigma-delta analogue-to-digital converter shown in FIG. 7 differs from that shown in FIG. 6 in that the second filter means is in two stages. In order that limiting means 7 receives a component corresponding to each filter order, resistor R4 is provided in series with parallel filter L4C4. The voltage developed across L3C3 appears across both L4C4 (corresponding to the fourth order component) and across R4 (corresponding to the third order component).

Of course, variations may be made without departing from the scope of the invention. Thus, the converters of FIGS. 6 and 7 may be adapted for baseband operation, in which case the parallel filters will be replaced by integrators. In the bandpass case the tuned circuits be replaced by transmission lines as in our patent application GB-92 22306.4. Instead of a 10 MHz sampling rate, this may be any value of radio frequency, for example, from the low frequency band from 30 kHz to the VHF band (from 30 MHz) to the UHF band (from 300 MHz) to the SHF band (from 3 GHz).

What is claimed is:

1. A sigma-delta circuit comprising quantising means for producing a digital output, a feedback path for feeding a signal derived from the digital output to be combined with a signal derived from an input to form an error signal, and first filter means connected to receive the error signal as input, a first output of the first filter means being fed to the quantising means, and second filter means also connected to the quantising means but via limiting means from a second output of the first filter means having a transfer function from its input such that the second filter means forms a sigma-delta circuit which includes the quantising means and the feedback path when the first-mentioned sigma-delta circuit is not overloaded.

2. A sigma-delta circuit as claimed in claim 1, in which the transfer function between the input of the first filter means and the second output is substantially the inverse of the function by which the quantisation noise would be suppressed by a first feedforward path in the absence of a second feedforward path.

3. A sigma-delta circuit as claimed in claim 1, in which the quantising means is single bit.

4. An analogue-to-digital converter for sampled data signals, comprising quantising means for producing a digital output, a feedback path for feeding a signal derived from the digital output to be combined with a signal derived from the sampled data signal for input to first filter means having one or two stages, a first feedforward path for feeding a first output of the first filter means to the quantising means, a second feedforward path for feeding a second output of the first filter means via second filter means having one or two stages and limiting means, to the quantising means, the transfer function between the input of the first filter means and its second output being such that the transfer function between the output of the second filter means around the feedback path and the second feedforward path to the input of the second filter means is defined over the passband of the converter by a phase response such as to produce a delay.

5. An analogue-to-digital converter as claimed in claim 4, in which the transfer function between the input of the first filter means and the second output is substantially the inverse of the function by which the quantisation noise would be suppressed by the first feedforward path in the absence of the second feedforward path.

6. An analogue-to-digital converter as claimed in claim 4, in which the transfer function between the output of the second filter means around the feedback path and the second feedforward path to the input of the second filter means is defined over the passband of the converter by a substantially flat amplitude response.

7. An analogue-to-digital converter as claimed in claim 4, in which the quantising means in single bit.

8. A digital modulator comprising quantising means for producing a digital output with a lower number of quantisation levels than the input, a feedback path for feeding a signal derived from the digital output to be combined with a signal derived from the digital input for input to first filter means having one or two stages, a first feedforward path for feeding a first output of the first filter means to the quantising means, a second feedforward path for feeding a second output of the first filter means via second filter means having one or two stages and limiting means, to the quantising means, the transfer function between the input of the first filter means and its second output being such that the transfer function between the output of the second filter means around the feedback path and the second feedforward path to the input of the second filter means is defined over the passband of the converter by a phase response such as to produce a delay.

9. An analogue-to-digital converter as claimed in claim 8, in which the transfer function between the input of the first filter means and the second output is substantially the inverse of the function by which the quantisation noise would be suppressed by the first feedforward path in the absence of the second feedforward path.

10. An analogue-to-digital converter as claimed in claim 8, in which the transfer function between the output of the second filter means around the feedback path and the second feedforward path to the input of the second filter means is defined over the passband of the converter by a substantially flat amplitude response.

11. An analogue-to-digital converter as claimed in claim 8, in which the quantising means is single bit.

12. An analogue-to-digital converter for continuous analogue signals comprising quantising means for producing a digital output, a feedback path for feeding a signal derived from the digital output to be combined with a signal derived from the analogue input for input to first filter means having one or two stages, a first feedforward path for feeding a first output of the first filter means to the quantising means, a second feedforward path for feeding a second output of the first filter means via second filter means having one or two stages and limiting means to the quantising means, the input to the limiting means being representative of each filter order of the first filter means combined with the second filter means along the second feedforward path.

* * * * *